(12) United States Patent
Kim et al.

(10) Patent No.: US 7,649,240 B2
(45) Date of Patent: Jan. 19, 2010

(54) SEMICONDUCTOR MEMORY DEVICE WITH VERTICAL FUSE

(75) Inventors: Kwang-duk Kim, Incheon (KR);
Jong-hyun Ahn, Suwon-si (KR);
Jeong-ho Shin, Uiwang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/704,300

(22) Filed: Feb. 9, 2007

(65) Prior Publication Data

US 2007/0181969 A1 Aug. 9, 2007

(30) Foreign Application Priority Data

Feb. 9, 2006 (KR) ................ 10-2006-0012681

(51) Int. Cl.
*H01L 29/00* (2006.01)
(52) U.S. Cl. ..................... 257/529; 438/215
(58) Field of Classification Search ......... 257/358–360, 257/363, 529, 209, 377, 530, 774, E23.145, 257/E23.151; 438/132, 215, 281, 333, 467, 438/601, 131, 600
See application file for complete search history.

(56) References Cited

U.S. PATENT DOCUMENTS

| 6,218,279 | B1 | 4/2001 | Weber et al. |
| 6,432,760 | B1 * | 8/2002 | Kothandaraman et al. ... 438/215 |
| 6,441,457 | B1 | 8/2002 | Park |
| 6,455,913 | B2 * | 9/2002 | Yeh et al. ..................... 257/529 |
| 2001/0002721 | A1 * | 6/2001 | Arndt et al. ................. 257/529 |
| 2003/0062590 | A1 * | 4/2003 | Anthony ..................... 257/529 |

FOREIGN PATENT DOCUMENTS

| JP | 2005-044962 | 2/2005 |
| KR | 10-2001-0018846 | 3/2001 |
| KR | 10-2005-0067511 | 7/2005 |

* cited by examiner

*Primary Examiner*—Andy Huynh
*Assistant Examiner*—Suberr Chi
(74) *Attorney, Agent, or Firm*—Lee & Morse, P.C.

(57) ABSTRACT

A semiconductor memory device having an improved fuse structure may include an interlayer insulating film on a semiconductor substrate, an opening in the interlayer insulating film, a vertical fuse that may conform to the opening, a fuse insulating film on the vertical fuse that may fill the opening, and metal wiring lines that may be electrically connected to the vertical fuse.

9 Claims, 7 Drawing Sheets

SEMICONDUCTOR MEMORY DEVICE WITH VERTICAL FUSE

BACKGROUND OF THE INVENTION

1. Field of the Invention

The present invention relates to a semiconductor memory device and a method of fabricating the same, more particularly, to an integrated semiconductor memory device and a method of fabricating the same.

2. Description of the Related Art

Fabricating semiconductor memory devices entails repetitively forming specific pattern on a wafer to produce an integrated circuit. Then, the wafer may be cut into unit chips, which may be packaged. In this case, before the wafer is cut into unit chips, the wafer undergoes an Electrical Die Sorting (EDS) process to examine the electrical characteristics of the unit chips. The EDS process examines the electrical characteristics of each cell to determine whether each cell is defective. In this case, if a cell is defective, the cell may be replaced by a previously manufactured redundancy cell. As a result, the defect rate may decrease, and the subsequent yield of semiconductor memory devices increases.

The repair process may be performed by irradiating a laser beam on wiring lines connected to defective cells to break the lines, or by allowing an over-current to flow to break the lines. In this case, the wiring line that may be broken by a laser beam or the over-current is referred to as a fuse.

As the technology advances, the integration density of semiconductor memory devices has increased, and fuses using over-current rather than a laser beam have become popular. An electrical fuse that may be broken by over current may be formed in a fuse region next to a region where a redundancy cell is formed. The fuse region is a region where electrical fuses are densely formed. However, as the semiconductor memory devices become more highly integrated, it may be necessary to decrease the area of the fuse region.

SUMMARY OF THE INVENTION

The present invention is therefore directed to a highly integrated semiconductor memory device and method of manufacturing the same, which substantially overcomes one or more of the problems due to the limitations and disadvantages of the related art.

It is therefore a feature of the present invention to provide a highly integrated semiconductor device having a fuse and a method of fabricating the same.

At least one of the above and other features and advantages of the present invention may be realized by providing a semiconductor memory device that may include an interlayer insulating film on a semiconductor substrate, an opening that may be in the interlayer insulating film, a vertical fuse that may conform to the opening, a fuse insulating film that may be on the vertical fuse, the fuse insulating film that may fill the opening, and metal wiring lines that may be electrically connected to the vertical fuse.

The vertical fuse may be a metal or a metal nitride. The vertical fuse may be composed of Ti, TiN, Ta, TaN or Al. The fuse insulating film may be composed of a material having a larger selectivity ratio than the interlayer insulating film. The interlayer insulating film may be a high density plasma oxide film. The fuse insulating film may be formed from Flowable Oxide (FOX), Tonen SilaZene (TOSZ), Spin-On-Glass (SOG), Undoped Silica Glass (USG), tetraethyl ortho silicate (TEOS), or Low Temperature Oxide (LTO). The metal wiring may be Cu or W. A barrier metal film may conform to the metal wiring line and the opening. The metal wiring line may be on the vertical fuse and the fuse insulating film. The fuse insulating film may fill a portion of the opening. The metal wiring line may fill a portion of the opening that the fuse insulating film does not fill, so that the metal wiring line may be in contact with a portion of the side of the vertical fuse.

At least one of the above and other features and advantages of the present invention may be realized by providing a method of fabricating a semiconductor memory device that may include forming an interlayer insulating film on a semiconductor substrate, forming an opening that may be in the interlayer insulating film; forming a conductive film that may be on the opening and the interlayer insulating film, the conductive film conforming to the opening and the interlayer insulating film, forming a fuse insulating film on the conductive film that may fill the opening, forming a vertical fuse that may be in the opening by removing the conductive film and fuse insulating film on the interlayer insulating film, and forming metal wiring lines may be electrically connected to the vertical fuse.

In the present invention, at least one of the following effects may be obtained. First, since the vertical fuse may be formed in the interlayer insulating film, it may beneficially be unnecessary to separately provide a region for forming a fuse. Second, since the region for forming a fuse decreases, the size of the semiconductor memory device may decrease, and a more integrated semiconductor memory device may be manufactured.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
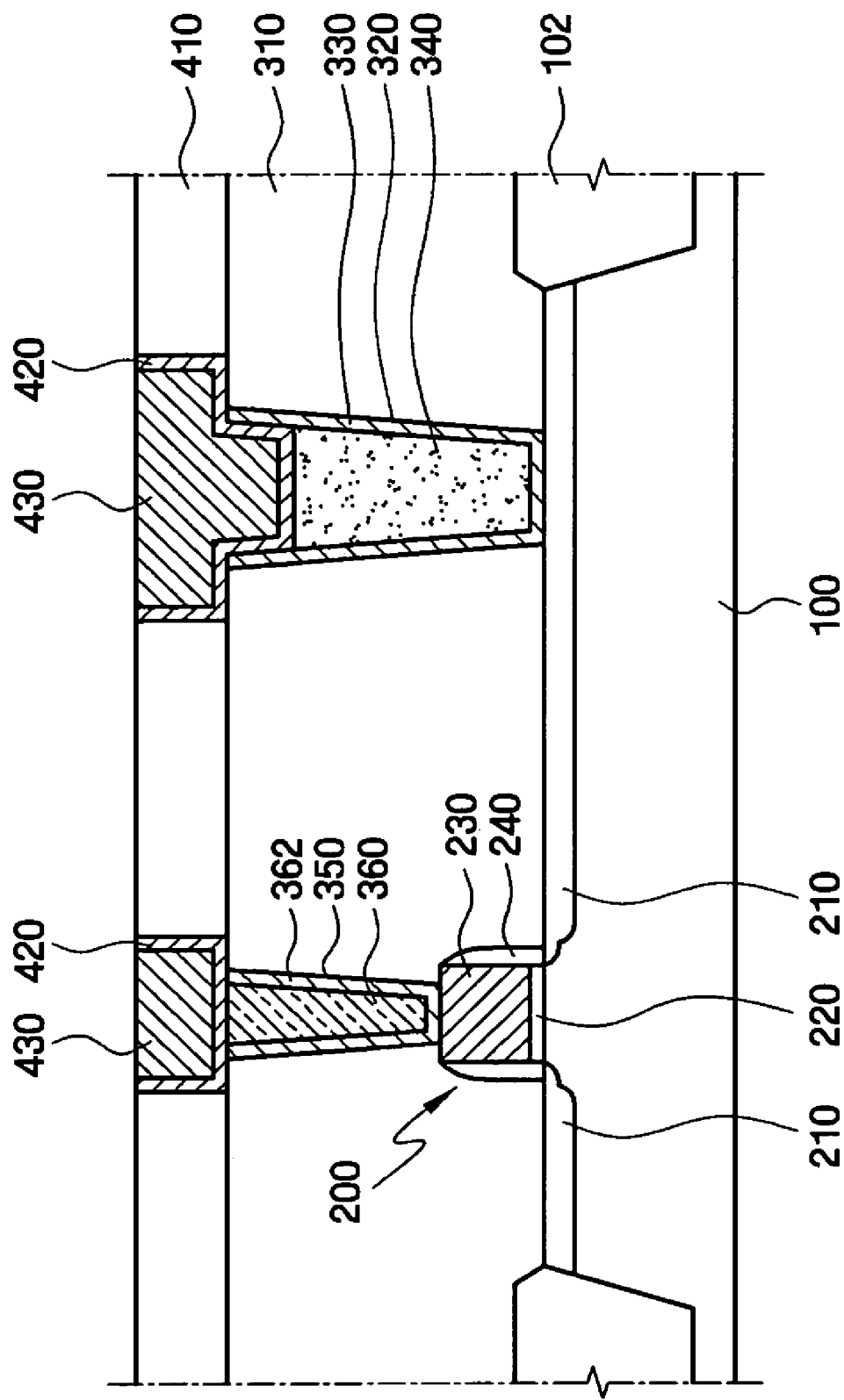
FIG. 1 illustrates a cross-sectional view of a semiconductor memory device according to an embodiment of the present invention.

Korean Patent Application No. 10-2006-0012681 filed on Feb. 9, 2006, in the Korean Intellectual Property Office, and entitled: "Semiconductor Memory Device and Method of Fabricating the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the present invention, at least one of the following effects may be obtained. First, since the vertical fuse may be formed in the interlayer insulating film, it may beneficially be unnecessary to separately provide a region for forming a fuse. Second, since the region for forming a fuse decreases, the size of the semiconductor memory device may decrease, and a more integrated semiconductor memory device may be manufactured.

Hereinafter, a semiconductor memory device according to an embodiment of the present invention will be described with reference to FIG. 1.

FIG. 1 depicts a semiconductor substrate 100, a first interlayer insulating film 310, a vertical fuse 330, a fuse insulating film 340, and metal wiring lines 430.

The semiconductor substrate 100 may be a silicon (Si) substrate, a silicon-on-insulator (SOI) substrate, a gallium arsenide (GaAs) substrate, a silicon germanium (SiGe) substrate, a ceramic substrate, a quartz substrate, or a glass substrate. These substrates may be for a display. Further, the semiconductor substrate 100 may generally be a P-type substrate, and although not shown, a P-type epitaxial layer may be grown in an upper part of the semiconductor substrate 100.

The semiconductor substrate 100 may be divided into an active region and an element separation region by an element separation film 102 that may be formed by Shallow Trench Isolation (STI) or Field OXide (FOX). A transistor 200 may be formed on the active region.

The transistor 200 may include source/drain regions 210 formed in the semiconductor substrate 100, a gate insulating film 220 and a gate electrode 230 that may be formed on a channel region between the source/drain regions 210. Further, spacers 240 may be formed at both sides of the gate electrode 230.

Meanwhile, although not shown in the drawing figures, silicide may be formed on the top surface of the gate electrode 230 and in an upper part of the source/drain regions 210. The silicide may reduce the resistivity of the gate electrode 230 and the parasitic resistance of the source/drain regions 210. A nitride film, which may serve as a barrier film, may be formed on the top surface of the semiconductor substrate 100 and the transistor 200.

The first interlayer insulating film 310 may be formed on the semiconductor substrate 100 where the transistor 200 is formed. The first interlayer insulating film 310 may be, e.g., a High Density Plasma (HDP) oxide film. An opening 320 may be formed in the first interlayer insulating film 310, and the vertical fuse 330 may conform to, i.e., coat, the opening 320.

The vertical fuse 330 may be formed of a metal or metal nitride having high conductivity and low resistance. For example, the vertical fuse can be formed of, e.g., Ti, TiN, Ta, TaN, Al, Cu, Au, etc. The thickness of the vertical fuse 330 may be, e.g., in the range of about 50 to 500 Å, preferably from about 100 to 400 Å. The vertical fuse 330 may be an electrical fuse that may be shorted, i.e., cut, by the overcurrent or over-voltage.

A fuse insulating film 340 may be formed on the vertical fuse 330 to fill a portion of the opening 320. The fuse insulating film 340 may be formed of material having a larger selectivity ratio than the first interlayer insulating film 310. In a case in which the first interlayer insulating film 310 is formed of an HDP film, the fuse insulating film 340 may be formed of, e.g., Flowable Oxide (FOX), Tonen SilaZene (TOSZ), Spin-On-Glass (SOG), Undoped Silica Glass (USG), tetraethyl ortho silicate (TEOS), or Low Temperature Oxide (LTO) film. The fuse insulating film 340 and the first interlayer insulating film 310 may surround the vertical fuse 330.

Also, a contact 360 may be formed in the first interlayer insulating film 310 so as to be located on the transistor 200. The contact 360 may electrically connect the gate electrode 230 of the transistor 200 and an upper metal wiring line 430. The contact 360 may be filled with a conductive material. In addition, since a barrier film 362 conforms to, i.e., coats, a contact hole 350 formed in the first interlayer insulating film 310, the barrier film 362 may be filled with the conductive material.

In this case, the conductive material may be, e.g., W, and the barrier film 362 may be formed of, e.g., Ti, TiN, WN, W, Ta, TaN, Ru, Cu, Al or a mixture thereof. The barrier film 362 reduce may reduce contact resistance between the conductive material and the gate electrode 230.

A second interlayer insulating film 410 may be formed on the first interlayer insulating film 310, and metal wiring lines 430 may be formed in or on the second interlayer insulating film 410. The metal wiring lines 430 may be, e.g., W or Cu. The metal wiring lines 430 may be electrically connected to the contact 360 and the vertical fuse 330 to apply voltage to the transistor 200 and vertical fuse 330. Further, a barrier metal film 420 may be located to conform under the metal wiring line 430. The barrier metal film 420 may be formed of, e.g., Ti, TiN, WN, W, Ta, TaN, Ru, Cu, Al, Au or a mixture thereof.

The metal wiring line 430 may be formed over the vertical fuse 330 and the fuse insulating film 340. The metal wiring line 430 may fill a part of the opening 320 that the fuse insulating film 340 does not fill, and the metal wiring line 430 may also contact a part of the side of the vertical fuse 330. In other words, since the fuse insulating film 340 may fill a part of the opening 320, the metal wiring line 430 can be brought into contact with a part of the side of the vertical fuse 330. Therefore, since the contact area of the vertical fuse 330 and metal wiring line 430 may increase, the contact resistance between the vertical fuse 330 and metal wiring line 430 may decrease.

The vertical fuse 330 may be formed of a thin conductive film and connected to the metal wiring line 430. Further, the vertical fuse 330 may be surrounded by the first interlayer insulating film 310 and the fuse insulating film 340. Therefore, if an over current or over voltage flows into the vertical fuse 330 through the metal wiring line 430, the vertical fuse 330 may be cut off, i.e., shorted.

The vertical fuse 330 may be formed in a region of the first interlayer insulating film 310 where the transistor 200 or contact hole may not be formed. Namely, since the vertical fuse 330 may be formed in an unoccupied region, there are benefits in that it may be unnecessary to provide a separate region for forming the vertical fuse 330. Therefore, since the fuse may be formed in a region which would not otherwise have been used, the size of the semiconductor memory device may decrease, thereby improving the integration of the semiconductor memory device.

Hereafter, a method of fabricating a semiconductor memory device of FIG. 1 according to an embodiment of the present invention will be described with reference to FIGS. 2 to 11.

Figure 2:
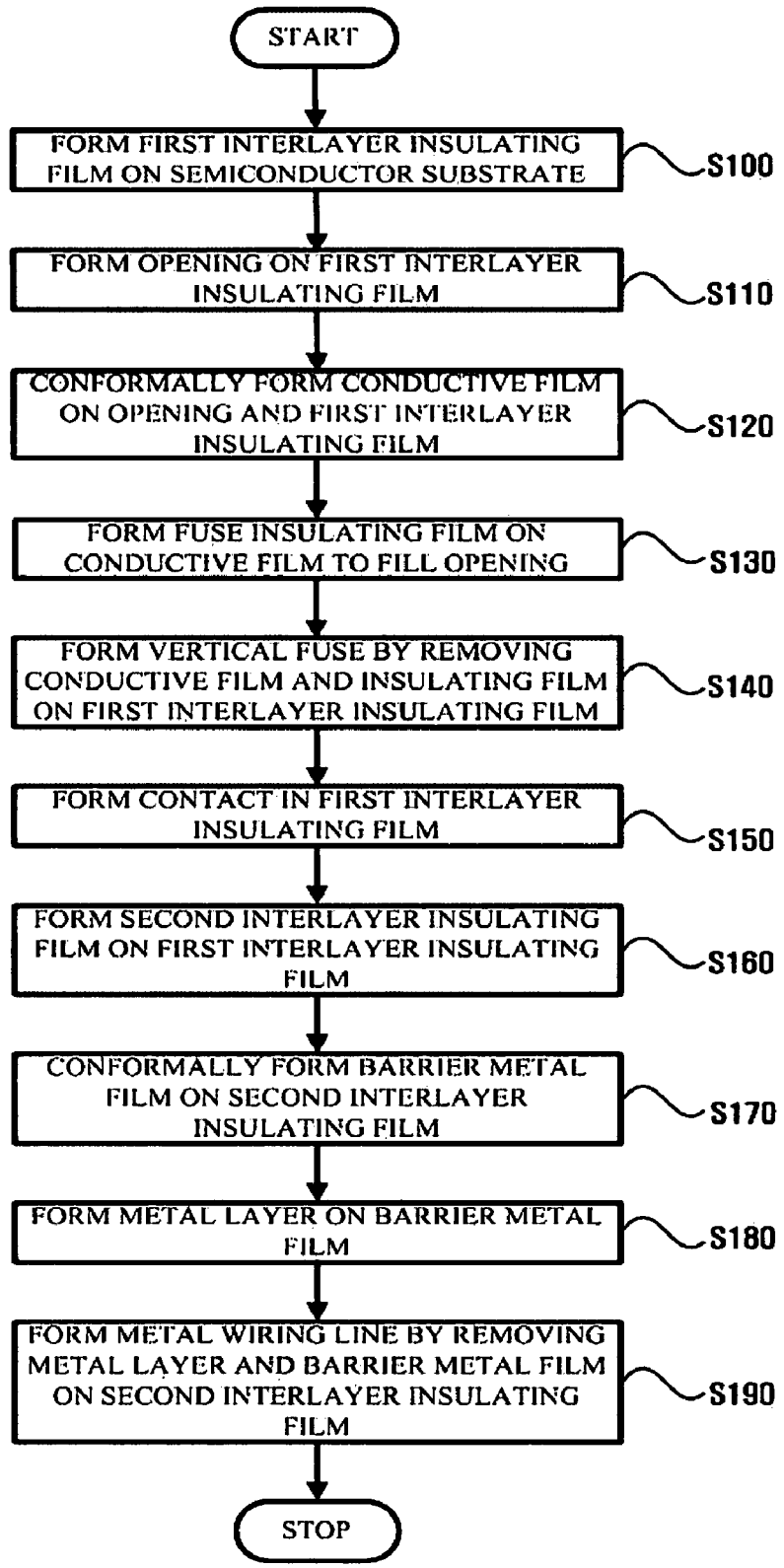
FIG. 2 illustrates a flow chart of a method of fabricating a semiconductor memory device according to an embodiment of the present invention.

FIG. 2 illustrates a flow chart of a method of fabricating a semiconductor memory device according to an embodiment of the present invention. FIGS. 3 to 11 illustrate cross-sectional views of stages in the method of fabricating a semiconductor memory device illustrated by the flowchart in FIG. 2.

Figure 3:
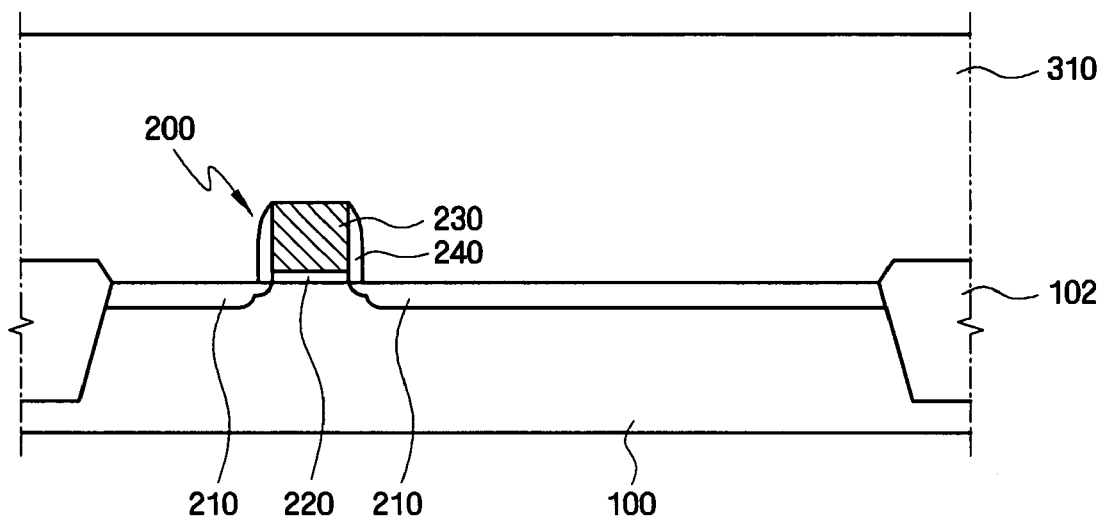
FIGS. 3 to 11 illustrate cross-sectional views of stages in a method of fabricating a semiconductor memory device according to an embodiment of the present invention.

In FIG. 2 and FIG. 3, the transistor 200 may be formed on the semiconductor substrate 100, which may be divided into an active region and a field region by the element separation film 102 using a conventional method, and the first interlayer insulating film 310 may be formed on the semiconductor substrate 100 (step S100).

Figure 4:
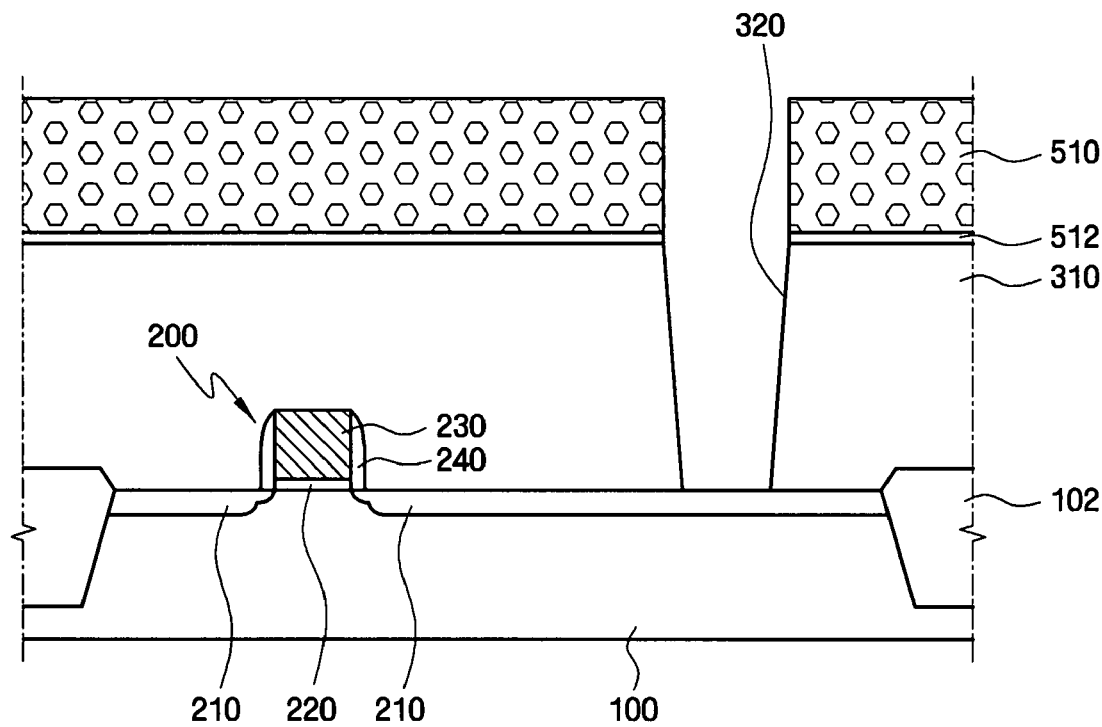

In FIG. 2 and FIG. 4, the opening 320 may be formed in the first interlayer insulating film 310 (step S110). In this step, a photoresist pattern 510 may be formed on the first interlayer insulating film 310, and the photoresist pattern 510 may then serve as an etching mask to perform an etching process so that the opening 320 may be formed in the first interlayer insulating film 310. In this case, a reflection preventive, i.e. anti-reflection, film 512 may be formed under the photoresist pattern 510. The opening 320 may be formed through the first interlayer insulating film 310 to expose the semiconductor substrate 100.

Figure 5:
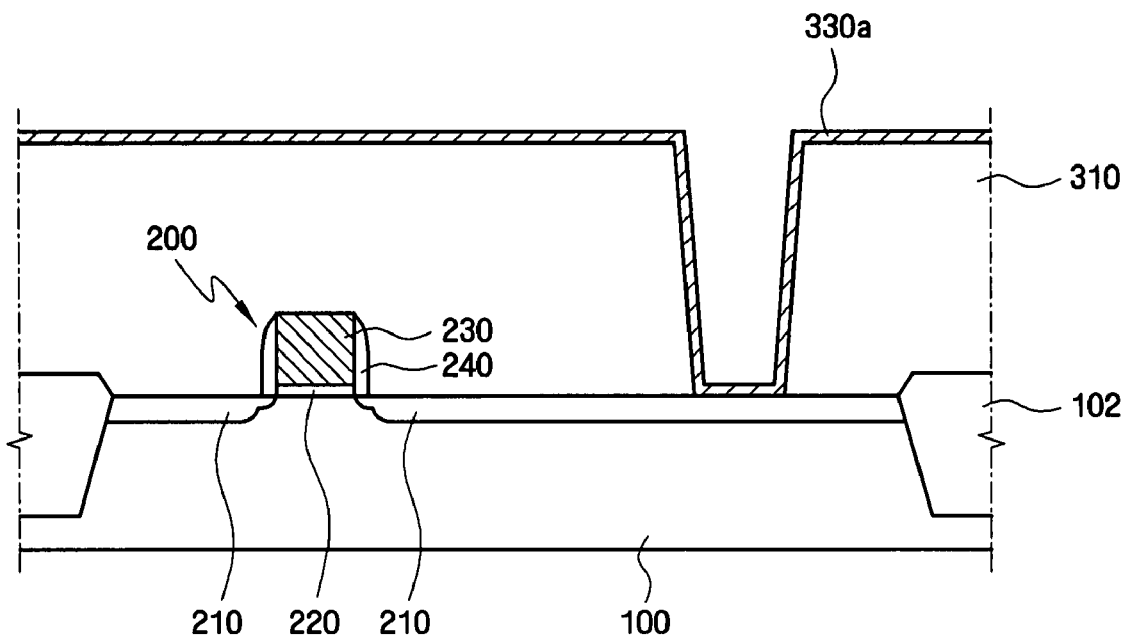

In FIG. 2 and FIG. 5, a conductive film 330a may be formed to conform to, i.e., coat, the opening 320 and the first interlayer insulating film 310 (step S120). In this case, the conductive film 330a may be formed of, e.g., Ti, TiN, Ta, TaN, Al, Cu, etc., by methods, such as Physical Vapor Deposition (PVD), Chemical Vapor Deposition (CVD) or Atomic Layer Deposition (ALD). The conductive film 330a maybe formed to have a thickness in the range of about 50 to 500 Å, e.g., from about 100 to 400 Å.

Figure 6:
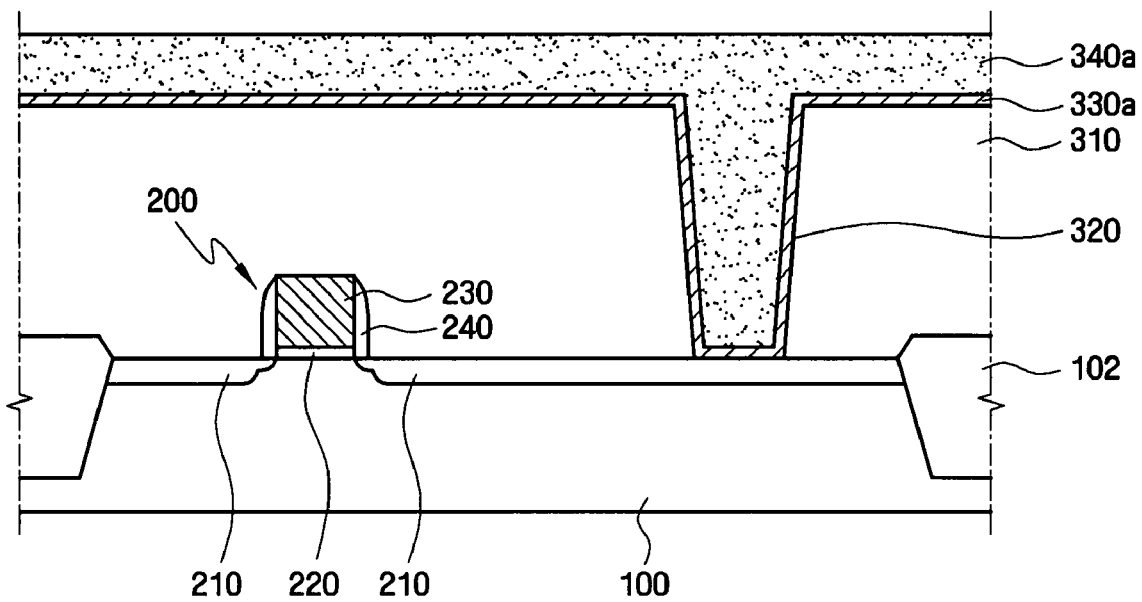

Next, referring to FIG. 2 and FIG. 6, a fuse insulating film 340a may be formed on the conductive film 330a to fill the opening 320 (step S130). The fuse insulating film 340a may be formed of material having a larger selectivity ratio than the first interlayer insulating film 310. As used herein, "selectivity ratio" is to mean selectivity of a removal process used to remove the fuse insulating film 340a. The fuse insulating film 340a may be formed so as to completely fill the opening 320 and cover an upper part of conductive film 330a.

Figure 7:
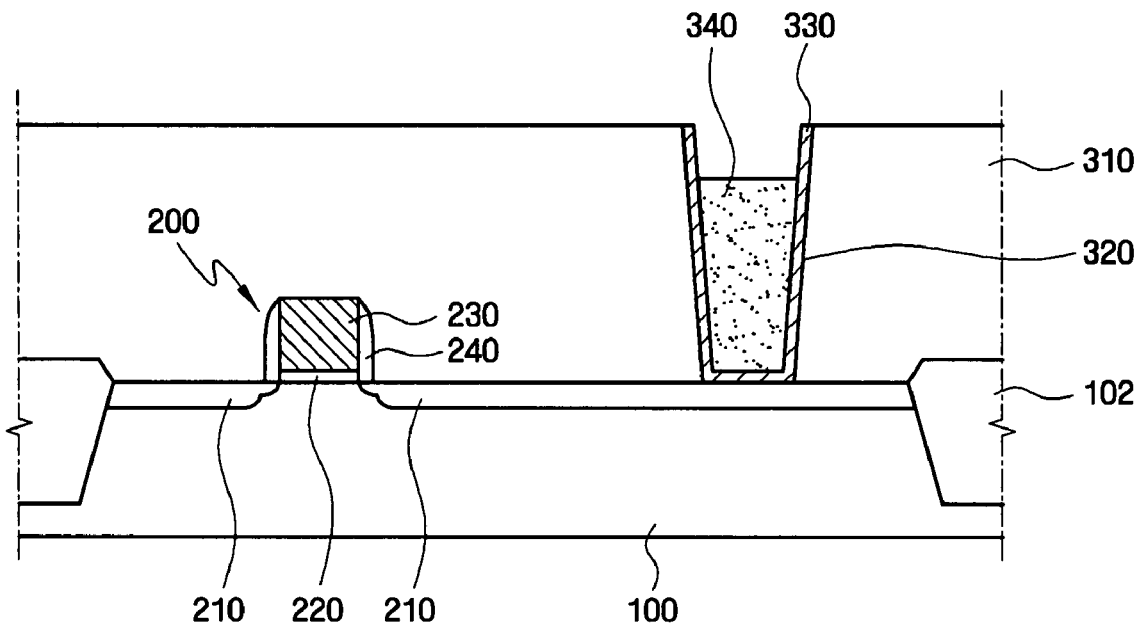

In FIG. 2 and FIG. 7, the vertical fuse 330 may be formed by removing the fuse insulating film (340a of FIG. 6) and the conductive film (330a of FIG. 6) on the first interlayer insulating film 310 (step S140). The fuse insulating film 340a and the conductive film 330a on the first interlayer insulating film 310 may be removed at the same time, or the films 330a, 340a may be sequentially removed.

If the fuse insulating film 340a and the conductive film 330a are removed at the same time, then they may be removed by a Chemical Mechanical Polishing (CMP) process, which may take into consideration the selectivity ratio of the fuse insulating film 340a and conductive film 330a. In this case, while removing the conductive film 330a on the first interlayer insulating film 310, a portion of the fuse insulating film 340a of the opening 320 may be removed. Since the fuse insulating film 340a on the opening 320 may not be sufficiently removed even after the conductive film 330a on the first interlayer insulating film 310 is removed, the fuse insulating film 340a on the opening 320 may be removed while removing a portion of the first interlayer insulating film 310. In this case, since the first interlayer insulating film 310 may have a smaller selectivity ratio, here, a polishing selectivity, than the fuse insulating film 340a, the fuse insulating film 340a on the opening 320 may be removed to a greater extent. Therefore, as illustrated in FIG. 7, the fuse insulating film 340 may be formed such that an upper part of the opening 320 may be empty.

Meanwhile, when the fuse insulating film 340a and the conductive film 330a are sequentially removed, the fuse insulating film 340 may first be removed and then the conductive film 330a may be removed. When removing the fuse insulating film 340a, the fuse insulating film may be removed by, e.g., a chemical mechanical polishing (CMP) process or an etch back process. In this case, the fuse insulating film 340a may be over etched so as to remove the fuse insulating film 340a at the upper part of the opening 320. The conductive film 330a may be removed by, e.g., chemical mechanical polishing (CMP).

In this case, since the fuse insulating film 340a formed on the opening 320 may be removed, and since the fuse insulating film 340 may fill only a portion of the opening, a portion of the side of the vertical fuse 330 may be exposed.

Figure 8:
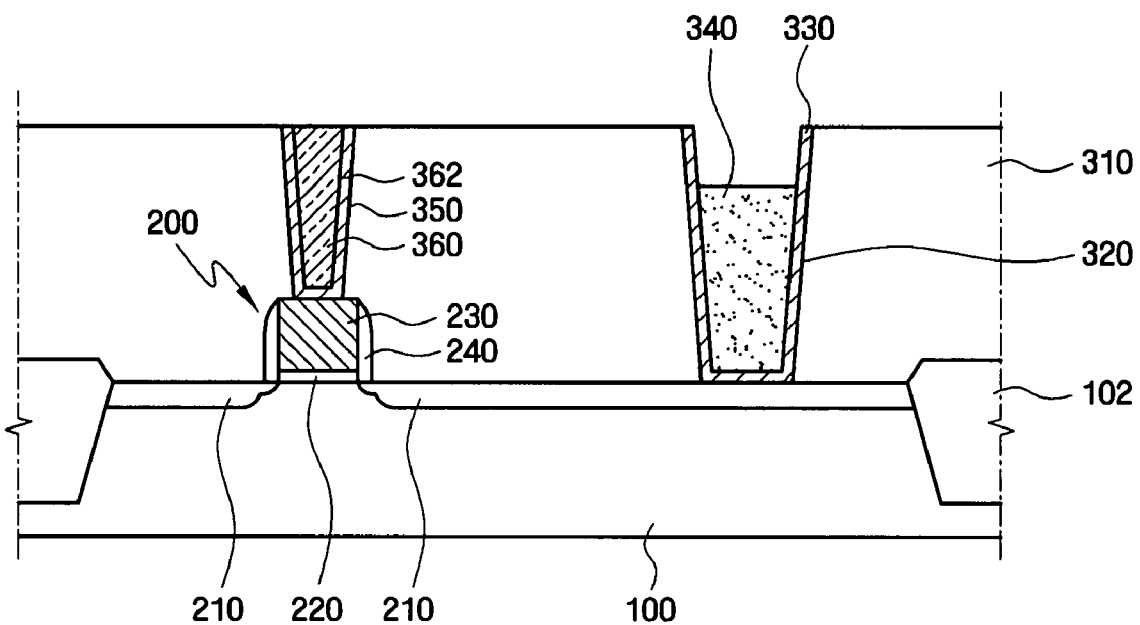

In FIG. 2 and FIG. 8, the contact 360 may be formed in the first interlayer insulating film 310 (step S150). The contact 360 may electrically connect the gate electrode 230 and the upper metal wiring line 430 of the semiconductor substrate 100.

That is, photoresist patterns may be formed on the first interlayer insulating film 310, thereby forming the contact hole 350 on the transistor 200. Subsequently, the barrier film 362 and metal film may be sequentially deposited. Then, the barrier film 362 and metal film on the first interlayer insulating film 310 may be removed via chemical mechanical polishing (CMP), so that the barrier film 362 and metal film may only fill the inside of the contact 360.

Figure 9:
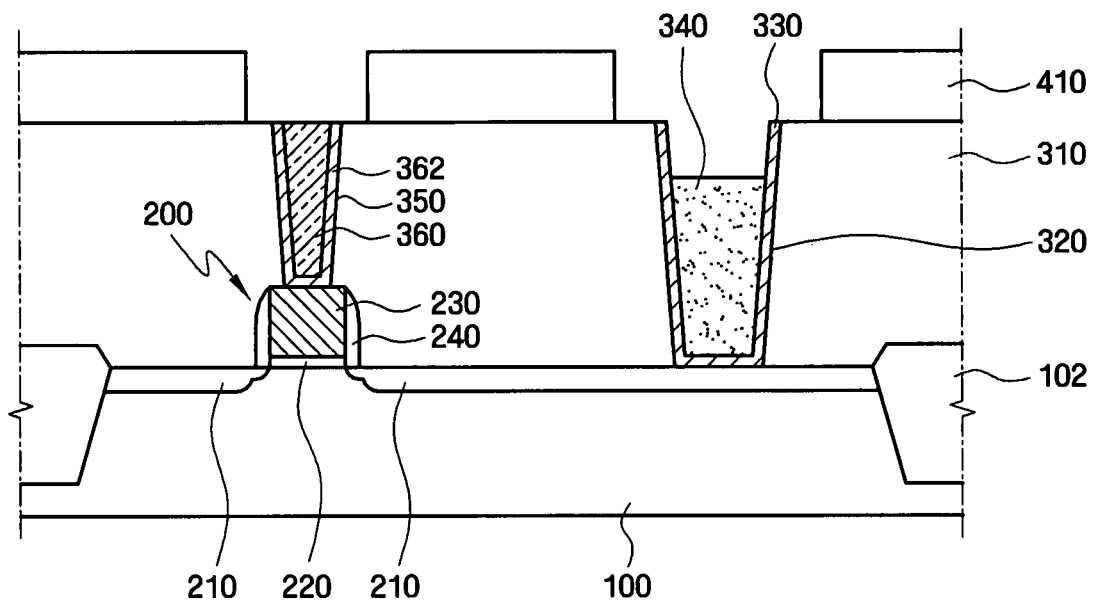

Next, referring to FIG. 2 and FIG. 9, the second interlayer insulating film 410 may be formed on the first interlayer insulating film 310 (step S160). Here, the second interlayer insulating film 410 may be formed so as to expose an upper part of the contact 360 and an upper part of the opening 320.

Figure 10:
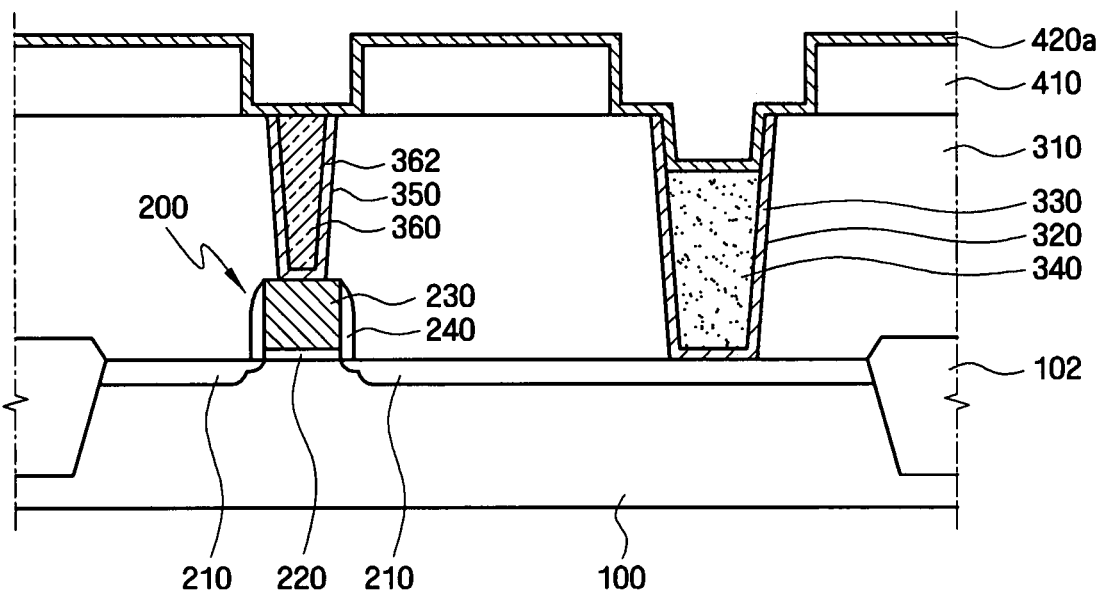

In FIG. 2 and FIG. 10, a barrier metal film 420a may be formed to conform to the second interlayer insulating film 410 (step S170). The barrier metal film 420a may be in contact with the contact 360, the vertical fuse 330 and the fuse insulating film 340 in an open region of the second interlayer insulating film 410. In this case, since the fuse insulating film 340 may only fill a portion of the opening 320, a portion of the side of the vertical fuse 330 may be exposed. Therefore, the barrier metal film 420a may be in contact with a portion of the side of the vertical fuse 330.

Since the barrier metal film 420a may be in contact with a portion of the side of the vertical fuse 330, an area where the barrier metal film 420a may be in contact with the vertical fuse 330 may increase. That is, the barrier metal film 420a may not be only in contact with an upper part of the vertical fuse 330, but also may be in contact with a portion of the side of the vertical fuse 330. Therefore, the area where the barrier metal film 420a may be in contact with vertical fuse 330 increases. Since the area where the barrier metal film 420a may be in contact with the vertical fuse 330 increases, contact resistance of the vertical fuse 330 and the metal wiring lines may decrease.

Figure 11:
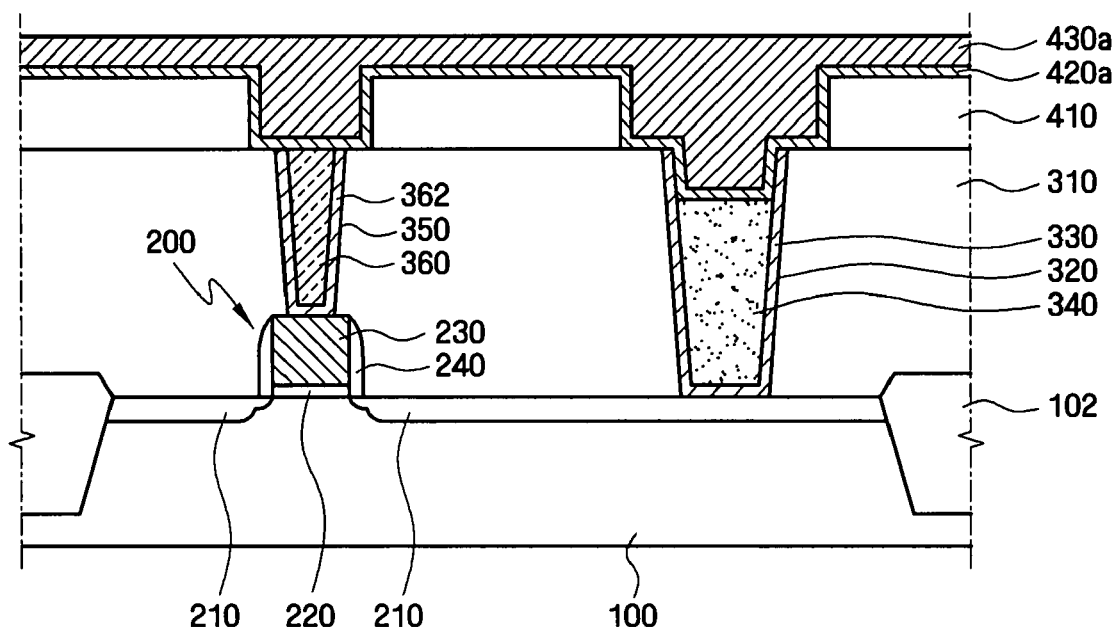

Next, FIG. 2 and FIG. 11 show a metal layer 430a may be formed on the barrier metal film 420a (step S180). The metal layer 430a may be formed so as to fill an open region of the second interlayer insulating film 410 and to cover the barrier metal film 420a. The metal layer 430a may be formed by, e.g., a chemical gaseous phase deposition method.

In FIG. 1 and FIG. 2, the metal wiring line 430 may be formed by removing the metal layer (430a of FIG. 11) and the barrier metal film (420a of FIG. 11) on the top surface of the second interlayer insulating film 410 (step S190). The removal of the metal layer 430a and the barrier metal film 420a on the top surface of the second interlayer insulating film 410 may be performed by, e.g., chemical mechanical polishing (CMP).

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in from and details may be made without departing from the spirit and scope of the present invention as set forth in the following claims.

What is claimed is:

1. A semiconductor memory device, comprising:
    an interlayer insulating film on a semiconductor substrate;
    an opening formed through the interlayer insulating film to expose a surface of the semiconductor substrate;
    a vertical fuse formed conformally on entire sidewalls of the opening and the exposed surface of the semiconductor substrate;
    a fuse insulating film on the vertical fuse, the fuse insulating film filling the opening; and
    a metal wiring line electrically connected to the vertical fuse,
    wherein the fuse insulating film fills a portion of the opening and the metal wiring line fills a portion of the opening that the fuse insulating film does not fill, such that the metal wiring line contacts at least a portion of the side of the vertical fuse.

2. The semiconductor memory device as claimed in claim 1, wherein the vertical fuse comprises a metal or a metal nitride.

3. The semiconductor memory device as claimed in claim 1, wherein the vertical fuse comprises Ti, TiN, Ta, TaN, or Al.

4. The semiconductor memory device as claimed in claim 1, wherein the fuse insulating film comprises a material having a larger selectivity ratio than the interlayer insulating film.

5. The semiconductor memory device as claimed in claim 4, wherein the interlayer insulating film comprises a high density plasma oxide film.

6. The semiconductor memory device as claimed in claim 4, wherein the fuse insulating film comprises a flowable oxide film, a tonen silazene film, a spin-on-glass film, an undoped silica glass film, a tetraethyl ortho silicate film, or a low temperature oxide film.

7. The semiconductor memory device as claimed in claim 1, wherein the metal wiring line comprises Cu or W.

8. The semiconductor memory device as claimed in claim 1, further comprising a barrier metal film that conforms to the metal wiring line and the opening.

9. The semiconductor memory device as claimed in claim 1, wherein the metal wiring line is on the vertical fuse and the fuse insulating film.

* * * * *